(12) United States Patent
Shim et al.

(10) Patent No.: US 12,101,955 B2
(45) Date of Patent: Sep. 24, 2024

(54) LIGHT EMITTING DISPLAY DEVICE

(71) Applicant: LG Display Co., Ltd., Seoul (KR)

(72) Inventors: Sungbin Shim, Paju-si (KR); Miryn Seong, Paju-si (KR); HanSol Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 449 days.

(21) Appl. No.: 17/517,675

(22) Filed: Nov. 3, 2021

(65) Prior Publication Data
US 2022/0165980 A1 May 26, 2022

(30) Foreign Application Priority Data

Nov. 20, 2020 (KR) .................... 10-2020-0156399

(51) Int. Cl.
| | |
|---|---|
| *H10K 50/824* | (2023.01) |
| *H10K 50/844* | (2023.01) |
| *H10K 59/122* | (2023.01) |
| *H10K 59/131* | (2023.01) |
| *H10K 59/38* | (2023.01) |

(52) U.S. Cl.
CPC ......... *H10K 50/824* (2023.02); *H10K 50/844* (2023.02); *H10K 59/122* (2023.02); *H10K 59/131* (2023.02); *H10K 59/38* (2023.02)

(58) Field of Classification Search
None
See application file for complete search history.

(56) References Cited

U.S. PATENT DOCUMENTS

| | | | | | |
|---|---|---|---|---|---|
| 7,839,083 | B2* | 11/2010 | Kubota | .............. | H10K 50/8426 313/506 |
| 2008/0197778 | A1* | 8/2008 | Kubota | ................ | H10K 59/124 315/73 |
| 2014/0312323 | A1* | 10/2014 | Park | .................... | H10K 59/1315 438/23 |
| 2014/0346484 | A1* | 11/2014 | Nendai | ................ | H10K 50/824 438/23 |

\* cited by examiner

*Primary Examiner* — Evren Seven
(74) *Attorney, Agent, or Firm* — Fenwick & West LLP (57) ABSTRACT

A light emitting display device comprises a substrate, a circuit layer having a thin film transistor and an auxiliary power electrode disposed on the substrate, an insulating layer disposed on the circuit layer and including a first opening which exposes a portion of the auxiliary power electrode, a pixel electrode disposed on the insulating layer and connected to the thin film transistor, an auxiliary electrode contact area formed in the insulating layer, an auxiliary electrode formed on the insulating layer, a light emitting layer disposed on the pixel electrode and the auxiliary electrode, a common electrode disposed on the light emitting layer and electrically connected with the auxiliary power electrode through the auxiliary electrode contact area, a filler disposed in the auxiliary electrode contact area, and an encapsulation layer disposed on the common electrode and the filler, wherein the first opening of the insulating layer includes an undercut area between the auxiliary power electrode and the auxiliary electrode, and wherein the undercut area is filled with the filler.

20 Claims, 9 Drawing Sheets

LIGHT EMITTING DISPLAY DEVICE

CROSS-REFERENCE TO RELATED APPLICATIONS

This application claims the benefit of Korean Patent Application No. 10-2020-0156399 filed on Nov. 20, 2020, which is hereby incorporated by reference as if fully set forth herein.

BACKGROUND

Field of the Invention

The present disclosure relates to a light emitting display device.

Discussion of the Related Art

With the advancement of the information age, the demand for a display device for displaying an image has increased with various forms.

Among such display devices, a light emitting display device is classified into an inorganic light emitting display device and an organic light emitting display device depending on a material of a light emitting layer. For example, the organic light emitting display device is a self-luminance display device which injects holes from an anode electrode and electrons from a cathode electrode into a light emitting layer and emits light when an exciton generated by combination of the injected holes and electrons falls from an excited state to a ground state.

The organic light emitting display device has a disadvantage of being easily degraded by external factors such as external moisture or oxygen. To avoid this, the organic light emitting display device forms an encapsulation layer so that external moisture or oxygen is not permeated into an organic light emitting element. At this time, the encapsulation layer includes at least one inorganic film and at least one organic film to prevent moisture or oxygen from being permeated into a light emitting layer and a cathode electrode.

The organic light emitting display device may be categorized into a top emission type, a bottom emission type, and a dual emission type depending on a direction in which light is emitted.

The top emission type organic light emitting display device may comprise a pixel circuit including a driving thin film transistor disposed in a subpixel area, an anode electrode connected to the driving thin film transistor, a light emitting layer disposed on the anode electrode, and a cathode electrode disposed on the light emitting layer, wherein light emitted from the light emitting layer passes through the cathode electrode. Therefore, the cathode electrode is formed of a transparent conductive material, whereby a problem occurs in that resistance of the cathode electrode is increased.

In order to reduce the number of masks, simplify the manufacturing process, and reduce resistance of the cathode electrode, a cathode contact structure has been recently suggested, in which the cathode electrode may directly be in contact with a low potential power line through an undercut structure that is formed such that an auxiliary electrode is used as an eave and a planarization layer below the auxiliary electrode is etched to expose the low potential power line.

However, in case of the cathode contact structure, since the eave is formed to form the undercut structure, a seam may occur in an inorganic film of the encapsulation layer due to the cathode contact structure. When such an inorganic seam occurs, moisture may be permeated through the inorganic film seam, and moisture may be permeated into a light emission area through an organic film of the encapsulation layer, whereby a problem may occur in that a reliability defect of the organic light emitting display device is caused.

The disclosure of the above-described background art is owned by the inventor of the present disclosure to devise the present disclosure or is technical information acquired by a process of devising the present disclosure, but cannot be regarded as the known art disclosed to the general public before the present disclosure is disclosed.

SUMMARY

The present disclosure has been made in view of the above problems and it is an object of the present disclosure to provide a light emitting display device that prevents moisture permeation by blocking a path through which external moisture is permeated, and has excellent reliability.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display device comprising a substrate, a circuit layer having a thin film transistor and an auxiliary power electrode disposed on the substrate, an insulating layer disposed on the circuit layer and including a first opening which exposes a portion of the auxiliary power electrode, a pixel electrode disposed on the insulating layer and connected to the thin film transistor, an auxiliary electrode contact area formed in the insulating layer, an auxiliary electrode formed on the insulating layer, a light emitting layer disposed on the pixel electrode and the auxiliary electrode, a common electrode disposed on the light emitting layer and electrically connected with the auxiliary power electrode through the auxiliary electrode contact area, a filler disposed in the auxiliary electrode contact area, and an encapsulation layer disposed on the common electrode and the filler, wherein the first opening of the insulating layer includes an undercut area between the auxiliary power electrode and the auxiliary electrode, and wherein the undercut area is filled with the filler.

In accordance with another aspect of the present disclosure, the above and other objects can be accomplished by the provision of a light emitting display device comprising a substrate, a circuit layer having a thin film transistor and an auxiliary power electrode disposed on the substrate, an insulating layer disposed on the circuit layer, a pixel electrode disposed on the insulating layer and connected to the thin film transistor, an auxiliary electrode formed on the insulating layer, a groove formed in an insulating layer to expose a portion of the auxiliary power electrode, a light emitting layer disposed on the pixel electrode and the auxiliary electrode, a common electrode disposed on the light emitting layer and the auxiliary electrode and electrically connected with the auxiliary power electrode through the groove, a filler disposed in the groove so that an upper surface of filler is equal to or higher than an upper surface of the groove, and an encapsulation layer disposed on the common electrode and the filler.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a temporal relationship, for example, when the temporal order is described as 'after~', 'subsequent~', 'next~' and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other and may be meant as directions having wider directivities within the range within which the elements of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of a light emitting display device according to the embodiment of the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 1:
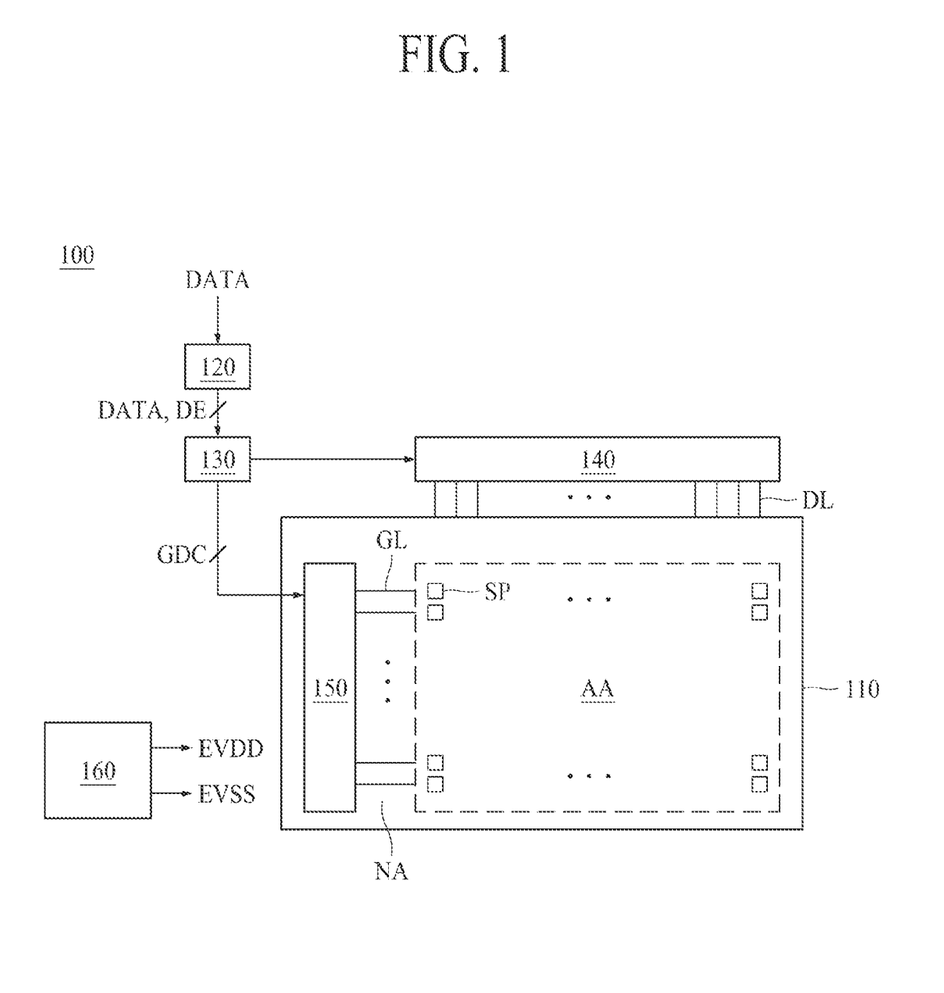
FIG. 1 is a schematic block view illustrating a light emitting display device according to the embodiment of the present disclosure.

FIG. 1 is a schematic block view illustrating a light emitting display device according to the embodiment of the present disclosure.

Referring to FIG. 1, a light emitting display device 100 according to the embodiment of the present disclosure may include a display panel 110, an image processor 120, a timing controller 130, a data driver 140, a scan driver 150, and a power supply 160.

The display panel 110 may display an image in response to a data signal DATA supplied from the data driver 140, a scan signal supplied from the scan driver 150, and a power source supplied from the power supply 160.

The display panel 110 may include subpixels SP disposed for each intersection area between a plurality of gate lines GL and a plurality of data lines DL. Various modifications may be made in a structure of the subpixel SP depending on a type of the display device 100.

For example, the subpixels SP may be formed according to the emission type of the display panel 110. The subpixels SP may include a red subpixel, a green subpixel and a blue subpixel, or may include a red subpixel, a blue subpixel, a white subpixel and a green subpixel. The subpixels SP may have one or more different light emission areas in accordance with light emission characteristics.

One or more subpixels SP may constitute one unit pixel. For example, one unit pixel may include red, green, blue and white subpixels, and red, green, blue and white subpixels may repeatedly be disposed, or red, green, blue and white subpixels may be disposed in a quad type. For example, in a quad-type arrangement, blue and red subpixels may be disposed in a first scan line, and green and white subpixels may be disposed in a second scan line. However, without limitation to this example, in the embodiment according to the present disclosure, a color type, an arrangement type, an arrangement order, etc. of the subpixels may be configured in various forms depending on the light emission characteristics, lifespan of an element, specification of the device, and the like.

The display panel 110 may be categorized into a display area AA on which the subpixels SP are disposed to display an image, and a non-display area NA in the vicinity of the display area AA. The scan driver 150 may be packaged in the non-display area NA of the display panel 110. Also, the non-display area NA may include a pad area.

The image processor 120 may output a data enable signal DE together with the data signal DATA supplied from the outside. The image processor 120 may output one or more of a vertical synchronization signal, a horizontal synchronization signal and a clock signal in addition to the data enable signal DE, but these signals are not shown for convenience of description.

The timing controller 130 may be supplied with the data signal DATA together with a driving signal from the image processor 120. The driving signal may include the data enable signal DE. Alternatively, the driving signal may include the vertical synchronization signal, the horizontal synchronization signal and the clock signal. The timing controller 130 may output a data timing control signal DDC for controlling an operation timing of the data driver 140 and a gate timing control signal GDC for controlling an operation timing of the scan driver 150, based on the driving signal.

The data driver 140 may sample and latch the data signal DATA supplied from the timing controller 130 in response to the data timing control signal DDC supplied from the timing controller 130, and may convert the latched data signal into a gamma reference voltage and output the gamma reference voltage.

The data driver 140 may output the data signal DATA through data lines DL. The data driver 140 may be embodied in the form of an integrated circuit (IC). For example, the data driver 140 may electrically be connected with the pad area disposed in the non-display area NA through a flexible circuit film.

The scan driver 150 may output the scan signal in response to the gate timing control signal GDC supplied from the timing controller 130. The scan driver 150 may output the scan signal through gate lines GL. The scan driver 150 may be embodied in the form of an integrated circuit (IC) or may be embodied in the display panel 110 in a gate-in-panel (GIP) type.

The power supply 160 may output a high potential voltage and a low potential voltage for driving the display panel 110. The power supply 160 may supply the high potential voltage to the display panel 110 through a first power line EVDD (or driving power line) and supply the low potential voltage to the display panel 110 through a second power line EVSS (or auxiliary power line).

Figure 2:
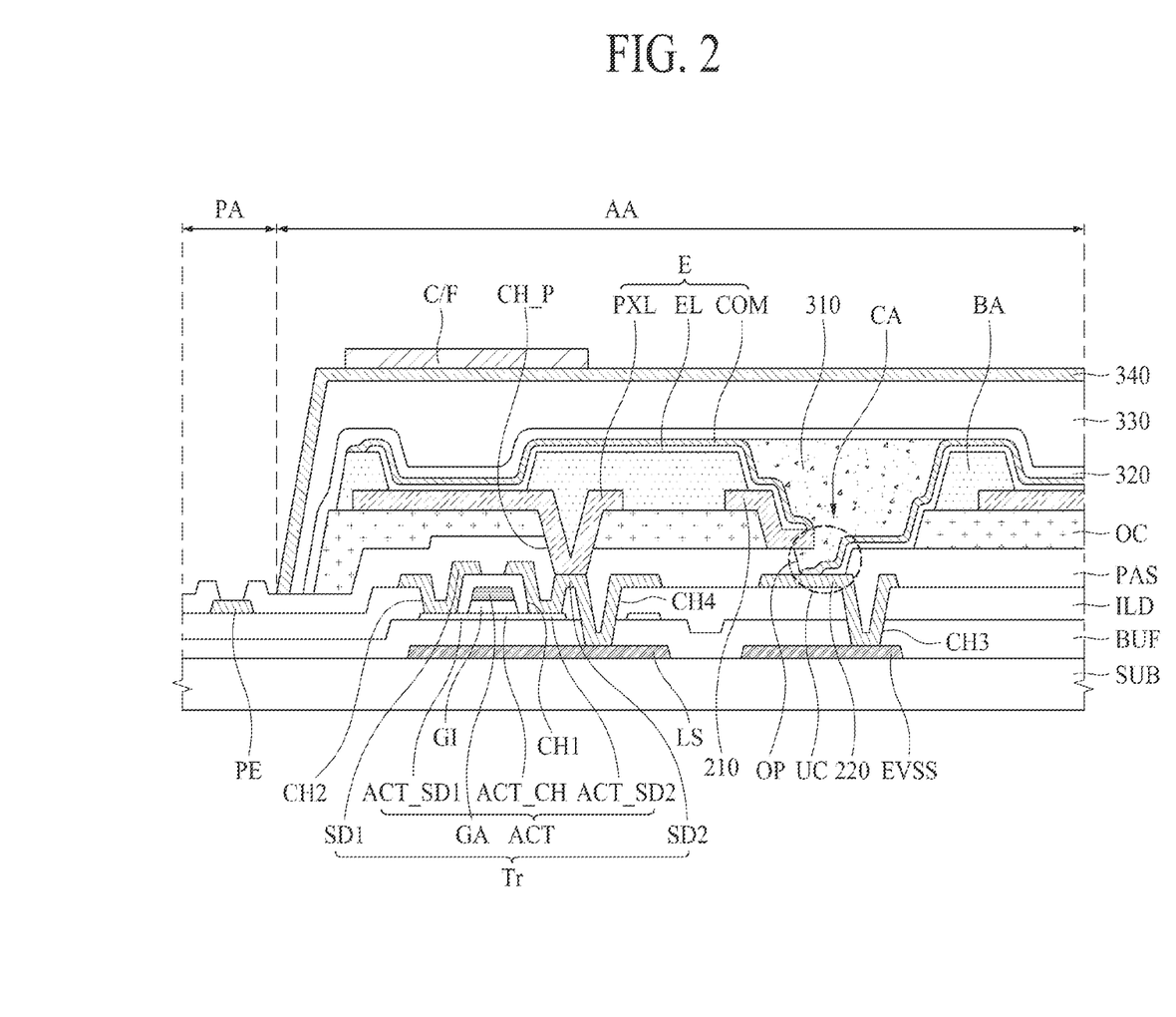
FIG. 2 is a cross-sectional view illustrating a light emitting display device according to the embodiment of the present disclosure.

FIG. 2 is a cross-sectional view illustrating a light emitting display device according to the embodiment of the present disclosure.

Referring to FIG. 2, the light emitting display according to the embodiment of the present disclosure may include a substrate SUB, a light shielding layer LS, an auxiliary power line EVSS, a buffer layer BUF a pad electrode PE, a thin film transistor Tr, a gate insulating layer GI, an inter-layer dielectric film ILD, an auxiliary power electrode 220, a passivation layer PAS, an overcoat layer OC, an auxiliary electrode 210, a light emitting element E, a bank B, an auxiliary electrode contact area CA (or groove), a filler 310, a first inorganic film 320, an organic film 330, a second inorganic film 340, and a color filter C/F.

The substrate SUB is a base substrate, and may be made of glass or plastic. For example, the substrate SUB may be formed of a plastic material such as polyimide (PI), polyethylene terephthalate (PET), polyethylene naphthalate (PEN), and polycarbonate (PC), and thus may have a flexible property. The substrate SUB may include a display area AA and a pad area PA, which are disposed thereon.

The buffer layer BUF and the inter-layer dielectric film ILD may be disposed in the pad area PA on the substrate SUB. The pad electrode PE may be disposed on the buffer layer BUF and the inter-layer dielectric film ILD. The passivation layer PAS may be formed on the pad electrode PE.

The light shielding layer LS and the auxiliary power line EVSS may be disposed in the display area AA on the substrate SUB. The light shielding layer LS may be disposed to overlap the thin film transistor Tr. For example, the light shielding layer LS may be disposed to overlap an active layer ACT of the thin film transistor Tr, especially a channel on a plane, and thus may serve to prevent external light from entering the active layer ACT. Also, the auxiliary power line EVSS (e.g., low potential power line or second power line) may serve to apply a low voltage to a common electrode COM (e.g., cathode electrode or second electrode). In addition, the auxiliary power line EVSS may serve to lower resistance of the common electrode COM together with the auxiliary power electrode 220.

The light shielding layer LS and the auxiliary power line EVSS may be formed of the same material on the same layer, and in this case, the light shielding layer LS and the auxiliary power line EVSS may be formed simultaneously through the same process.

The buffer layer BUF may be disposed on the substrate SUB to cover the light shielding layer LS and the auxiliary power line EVSS. The buffer layer BUF may be formed in such a manner that a single layer or a plurality of inorganic films are deposited. For example, the buffer layer BUF may be formed of a single layer comprised of a silicon oxide film (SiOx), a silicon nitride film (SiNx), and a silicon oxynitride film (SiOxNy). Alternatively, the buffer layer BUF may be formed of a multi-layer in which at least two films of a silicon oxide film (SiOx), a silicon nitride film (SiNx) and a silicon oxynitride film (SiOxNy) are deposited. The buffer layer BUF may be formed on an entire upper surface of the substrate SUB in order to block moisture from being permeated into the light emitting element E through the substrate SUB.

The thin film transistor Tr and the auxiliary power electrode 220 may be disposed on the buffer layer BUF. The thin film transistor Tr may be disposed in each of a plurality of subpixels on the buffer layer BUF. For example, the thin film transistor Tr may include an active layer ACT, a gate electrode GA overlapping the active layer ACT with the gate insulating layer GI interposed therebetween, a first source/drain electrode SD1 and a second source/drain electrode SD2.

The active layer ACT may be made of a silicon-based or oxide-based semiconductor material, and may be formed on the buffer layer BUF. The active layer ACT may include a channel area ACT_CH overlapped with the gate electrode GA, a first source/drain area ACT_SD1 connected with the first source/drain electrode SD1, and a second source/drain area ACT_SD2 connected with the second source/drain electrode SD2.

The gate insulating layer GI may be formed on the active layer ACT. The gate insulating layer GI may be disposed on the channel area ACT_CH of the active layer ACT, and may serve to insulate the active layer ACT from the gate electrode GA. Therefore, the gate insulating layer GI may be made of an inorganic insulating material. For example, the gate insulating layer GI may be formed of a silicon oxide film (SiOx), a silicon nitride film (SiNx), a silicon oxynitride film (SiOxNy) or a multi-layer thereof.

The gate electrode GA may be formed on the gate insulating layer GI. The gate electrode GA may be disposed to face the active layer ACT with the gate insulating layer GI interposed therebetween. The gate electrode GA may be formed of a single layer or multiple layers of any one selected from a group of copper (Cu), molybdenum (Mo), aluminum (Al), chromium (Cr), gold (Au), titanium (Ti), nickel (Ni), neodymium (Nd), tantalum (Ta) and tungsten (W), or their alloy.

The inter-layer dielectric film ILD covering the gate electrode GA may be formed on the buffer layer BUF. The inter-layer dielectric film ILD may serve to protect the thin film transistor Tr. The inter-layer dielectric film ILD may be made of an inorganic insulating material. For example, the Inter-layer dielectric film ILD may be formed of a silicon oxide film (SiOx), a silicon nitride film (SiNx), a silicon oxynitride film (SiOxNy), or a multi-layer thereof.

The first and second source/drain electrodes SD1 and SD2 may be formed on the inter-layer dielectric film ILD. A corresponding area of the inter-layer dielectric film ILD may be removed to allow the active layer ACT to be in contact with the first and second source/drain electrodes SD1 and SD2. For example, the inter-layer dielectric film ILD may include a first contact hole CH1 for allowing the first source/drain electrode SD1 to be in contact with the first source/drain area ACT_SD1 of the active layer ACT, and a second contact hole CH2 for allowing the second source/drain electrode SD2 to be in contact with the second source/drain area ACT_SD2 of the active layer ACT. Also, the auxiliary power electrode 220 may be formed on the inter-layer dielectric film ILD. A third contact hole CH3 for electrically connecting the auxiliary power electrode 220 with the auxiliary power line EVSS may be formed in the inter-layer dielectric film ILD and the buffer layer BUF below the inter-layer dielectric film ILD. In addition, a fourth contact hole CH4 for electrically connecting the first source/drain electrode SD1 with the light shielding layer LS may be formed in the inter-layer dielectric film ILD and the buffer layer BUF below the inter-layer dielectric film ILD. Alternatively, the fourth contact hole CH4 may be formed to connect the second source/drain electrode SD2 with the light shielding layer LS.

The first and second source/drain electrodes SD1 and SD2 and the auxiliary power electrode 220 may be made of the same material in the same layer. The first and second source/drain electrodes SD1 and SD2 and the auxiliary power electrode 220 may simultaneously be formed through the same process. The first and second source/drain electrodes SD1 and SD2 and the auxiliary power electrode 220 may be a single layer or multiple layers. When the first and second source/drain electrodes SD1 and SD2 and the auxiliary power electrode 220 are formed of a single layer, they may be formed of any one selected from a group of molybdenum (Mo), aluminum (Al), chromium (Cr), gold (Au), titanium (Ti), nickel (Ni), neodymium (Nd) and copper (Cu), or their alloy. In addition, when the first and second source/drain electrodes SD1 and SD2 and the auxiliary power electrode 220 are multi-layers, they may be formed of a double layer of molybdenum/aluminum-neodymium, molybdenum/aluminum, titanium/aluminum or copper/molybdenum titanium. Alternatively, the first and second source/drain electrodes SD1 and SD2 and the auxiliary power electrode 220 may be formed of a triple layer of Mo/Al-Nd/Mo, Mo/Al/MO, Ti/Al/Ti, or MoTi/Cu/MoTi. However, without limitation to this example, the first and second source/drain electrodes SD1 and SD2 and the auxiliary power electrode 220 may be formed of multi-layer of any one selected from a group of molybdenum (Mo), aluminum (Al), chromium (Cr), gold (Au), titanium (Ti), nickel (Ni), neodymium (Nd) or copper (Cu), or their alloy.

The thin film transistor Tr and the auxiliary power electrode 220 disposed on the substrate SUB may constitute a circuit layer (or a thin film transistor array layer).

The passivation layer PAS may be disposed on the thin film transistor Tr and the auxiliary power electrode 220. The passivation layer PAS may cover the thin film transistor Tr and the auxiliary power electrode 220. The passivation layer PAS protects the thin film transistor Tr, and may be made of an inorganic insulating material. For example, the passivation layer PAS may be formed of a silicon oxide film (SiOx), a silicon nitride film (SiNx), a silicon oxynitride film (SiOxNy) or a multi-layer thereof.

The overcoat layer OC may be disposed on the passivation layer PAS. The overcoat layer OC planarizes a step difference in under layers, and may be made of an organic material. For example, the overcoat layer OC may be made of at least one organic material of photo acryl, polyimide, benzocyclobutene resin or acrylate-based resin. If necessary, any one of the passivation layer PAS and the overcoat layer OC may be omitted.

A pixel electrode PXL (e.g., anode electrode or first electrode) and the auxiliary electrode 210 may be disposed on the overcoat layer OC. The pixel electrode PXL and the auxiliary electrode 210 may be disposed to be spaced apart from each other, and may be made of the same material in the same layer. The pixel electrode PXL and the auxiliary electrode 210 may be formed simultaneously through the same process.

The pixel electrode PXL may be connected to the first source/drain electrode SD1 of the thin film transistor Tr through a contact hole CH_P that passes through the passivation layer PAS and the overcoat layer OC. Alternatively, the pixel electrode PXL may be connected to the second source/drain electrode SD2 of the thin film transistor Tr. A light emitting layer EL and the common electrode COM may be disposed on the pixel electrode PXL. Therefore, the light emitting element E including the pixel electrode PXL, the light emitting layer E and the common electrode COM may be provided.

The auxiliary electrode 210 may be formed over the overcoat layer OC and the passivation layer PAS. One end (or end) of the auxiliary electrode 210 may be formed on the passivation layer PAS. One end of the auxiliary electrode 210 may overlap a portion of the auxiliary power electrode 220 with the passivation layer PAS interposed therebetween. The passivation layer PAS may include an opening OP that exposes a portion of the auxiliary power electrode 220. The opening OP of the passivation layer PAS may be formed between a portion of the auxiliary power electrode 220 and the auxiliary electrode 210. The opening OP of the passivation layer PAS may include an undercut area UC that exposes a portion of the auxiliary power electrode 220 and a portion below one end (or end) of the auxiliary electrode 210. One end (or end) of the auxiliary electrode 210 may serve as an eave. The overcoat layer OC and the passivation layer PAS may be formed to have a step difference structure, whereby an auxiliary electrode contact area CA (or groove) having an undercut area UC may be formed. The auxiliary electrode 210 may cover a side and a partial upper surface of the overcoat layer OC. The auxiliary electrode 210 may cover the upper surface of the passivation layer PAS, which is exposed by the step difference structure of the overcoat layer OC and the passivation layer PAS. In addition, one end (or end) of the auxiliary electrode 210 may have an eave structure protruding from the end of the passivation layer PAS. In this way, a portion of the lower surface of the auxiliary electrode 210 may be exposed by the eave structure based on one end (or end) of the auxiliary electrode 210.

In the auxiliary electrode contact area CA, the auxiliary power electrode 220 exposed by the opening OP of the passivation layer PAS may electrically be connected with the common electrode COM (e.g., cathode electrode or second electrode).

A bank layer BA may be disposed on the pixel electrode PXL, the auxiliary electrode 210 and the overcoat layer OC. The bank layer BA may be disposed on the overcoat layer OC. The bank layer BA may define an opening on the pixel electrode PXL and also define the auxiliary electrode contact area CA (or groove). For example, the bank layer BA may be disposed to expose a central portion of the pixel electrode PXL but cover an edge of the pixel electrode PXL. In addition, the bank layer BA may be disposed to expose one end (or end) of the auxiliary electrode 210 but cover the other end of the auxiliary electrode 210.

The light emitting layer EL may be disposed on the pixel electrode PXL and the bank layer BA. The light emitting layer EL may be formed to be disconnected from the eave structure by one end (or end) of the auxiliary electrode 210 positioned at one side of the auxiliary electrode contact area CA. The light emitting layer EL may be connected with the auxiliary power electrode 220 exposed through the undercut area UC along the step difference structure based on the overcoat layer OC and the passivation layer PAS, which are positioned at the other side of the auxiliary electrode contact area CA.

Referring to FIG. 2, the light emitting layer EL may be disconnected from the auxiliary power contact are CA through the undercut area UC. The disconnected light emitting layer EL may be connected with the auxiliary power electrode 220 exposed through the undercut area UC in the auxiliary electrode contact area CA.

The common electrode COM may be disposed on the light emitting layer EL. The common electrode COM may be formed to be disconnected from the eave structure based on one end (or end) of the auxiliary electrode 210 positioned at one side of the auxiliary electrode contact area CA. The common electrode COM may electrically be connected with the auxiliary power electrode 220 exposed through the undercut area UC along the step difference structure of the overcoat layer OC and the passivation layer PAS, which are positioned at the other side of the auxiliary electrode contact area CA.

Referring to FIG. 2, the common electrode COM may be disconnected from the auxiliary electrode contact area CA through the undercut area UC. The disconnected common electrode COM may be connected with the auxiliary power electrode 220 exposed through the undercut area UC in the auxiliary electrode contact area CA.

In the light emitting display device according to the embodiment of the present disclosure, the filler 310 may be disposed in the auxiliary electrode contact area CA (or groove). The filler 310 may fill the groove by the auxiliary electrode contact area CA. The filler 310 planarizes the step difference caused by the auxiliary electrode contact area CA (or groove), and may include a polymer-based organic material. For example, an acrylic resin, an epoxy resin, a polyimide, or polyethylene may be used as the filler 310. According to the embodiment of the present disclosure, as the auxiliary electrode contact area CA is filled with the filler 310, damage to an encapsulation layer in which at least one inorganic film and at least one organic film are alternately deposited may be minimized to prevent moisture or oxygen from being permeated into the light emitting element E. For example, the encapsulation layer may include a first inorganic film 320, an organic film 330 and a second inorganic film 340.

As shown in FIG. 2, the first inorganic film 320 constituting the encapsulation layer may be disposed on the common electrode COM and the filler 310, the organic film 330 may be disposed on the first inorganic film 320, and the second inorganic film 340 may be disposed on the organic film 330. The color filter C/F may be disposed on the second inorganic film 340 and overlapped with the pixel electrode PXL.

Figure 3:
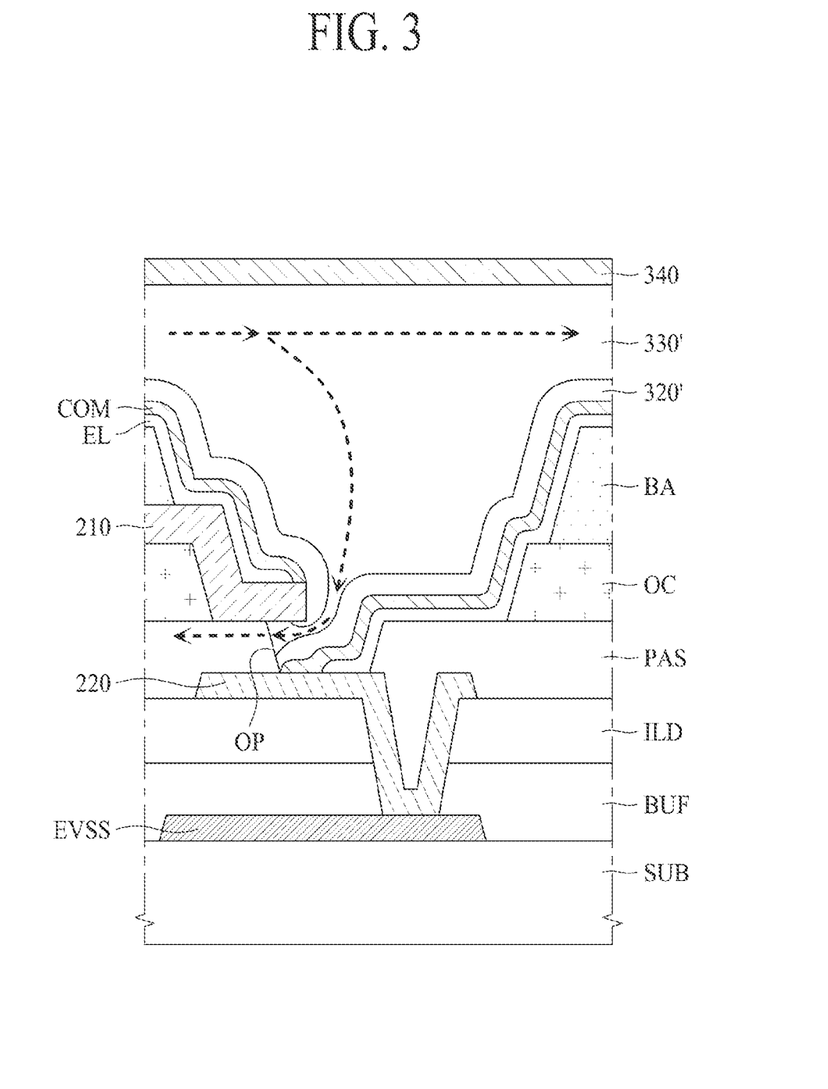
FIG. 3 is a view illustrating a moisture permeation path caused by a seam in an encapsulation layer according to a comparative example.
Figure 4:
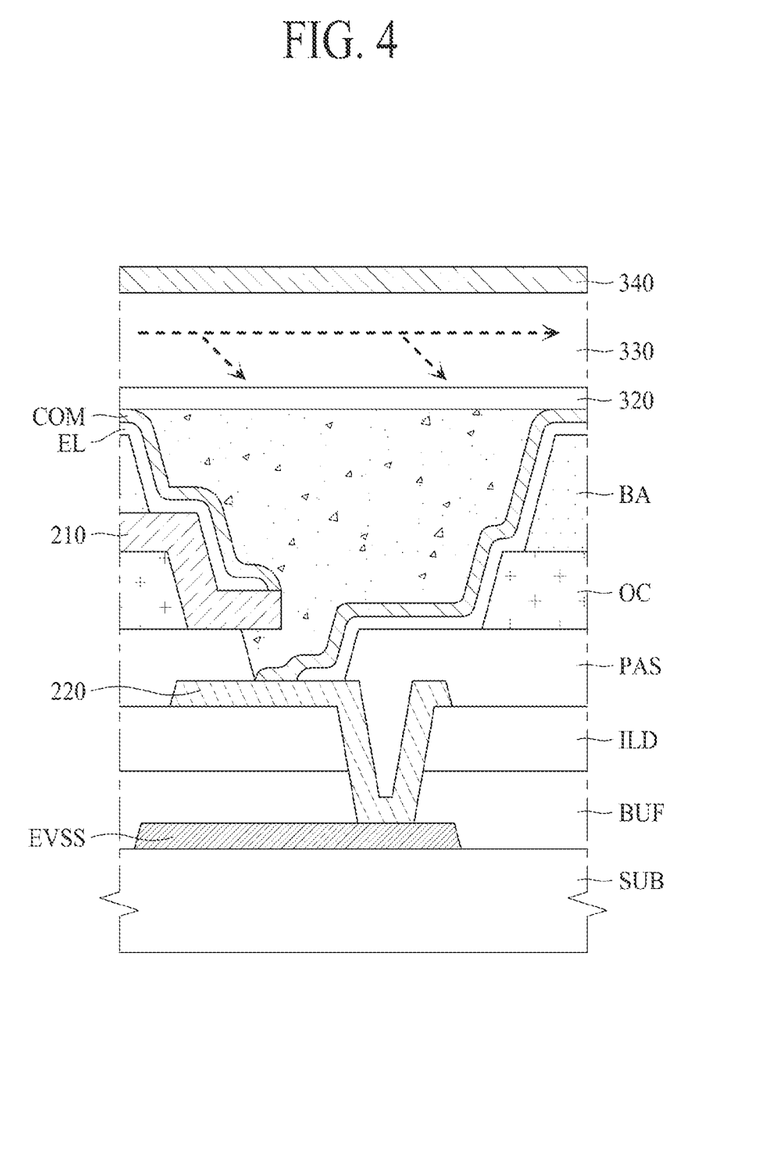
FIG. 4 is a view illustrating that a moisture permeation path is blocked in an encapsulation layer in accordance with the embodiment of the present disclosure.

FIG. 3 is a view illustrating a moisture permeation path caused by a seam in an encapsulation layer according to a comparative example. FIG. 4 is a view illustrating that a moisture permeation path is blocked in an encapsulation layer in accordance with the embodiment of the present disclosure.

As shown in FIG. 3, when the filler 310 is not filled in the auxiliary electrode contact area CA, a seam may occur in the first inorganic film 320' due to the auxiliary electrode contact area CA. An organic film 330' may be disposed in an area where the first inorganic film 320' is cut by occurrence of the seam. Therefore, as the organic film 330', which may be a moisture moving path from the outside, is disposed in the cut area of the first inorganic film 320', moisture may be permeated into the light emission area through the organic film 330' disposed in the cut area of the first inorganic film 320'.

As shown in FIG. 4, in the embodiment of the present disclosure, the filler 310 is filled in the auxiliary electrode contact area CA, whereby the groove by the auxiliary electrode contact area CA may be planarized. Then, a seam may be prevented from occurring in the first inorganic film 320 disposed on the common electrode COM and the filler 310. The organic film 330 may be formed to be flat on the first inorganic film 320. Therefore, even though moisture permeated from the outside is moved through the organic film 330, a moisture movement path is blocked by the first inorganic film 320, whereby a moisture permeation path through the organic film 330 on the first inorganic film 320 may be blocked.

Figure 5:
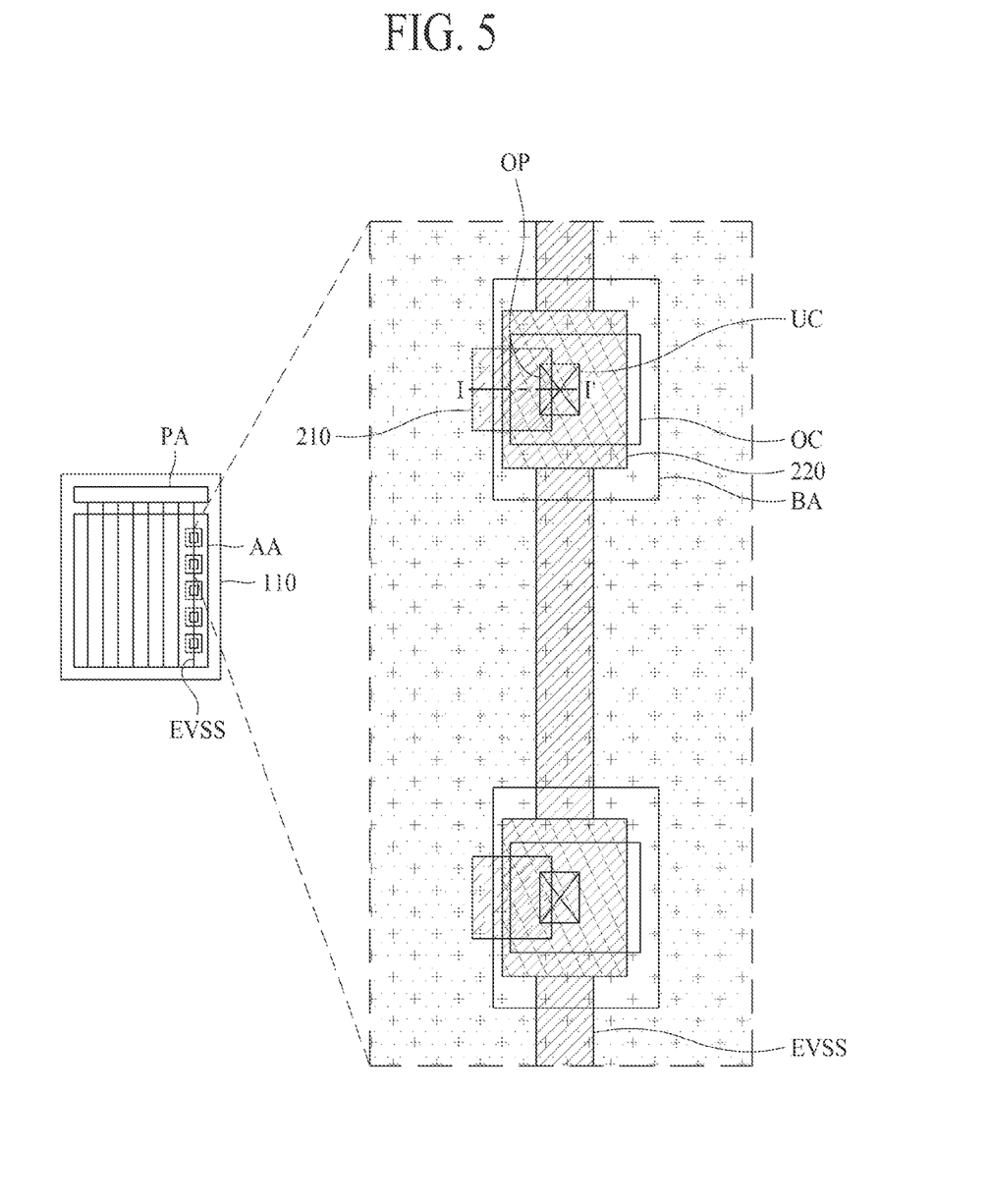
FIG. 5 is a schematic plane view illustrating an example of a display device in a light emitting display device according to the embodiment of the present disclosure.
Figure 6:
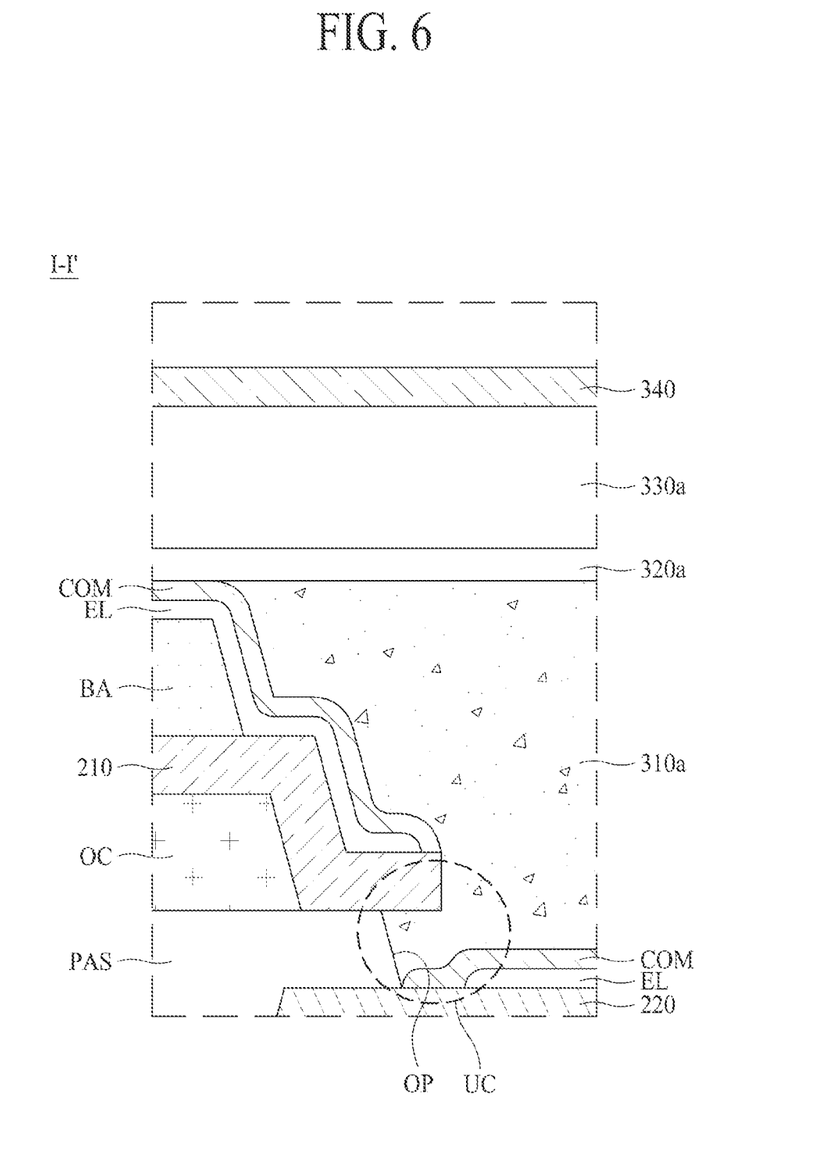
FIG. 6 is a cross-sectional view taken along line I-I' of FIG. 5 according to one embodiment of the present disclosure.
Figure 7:
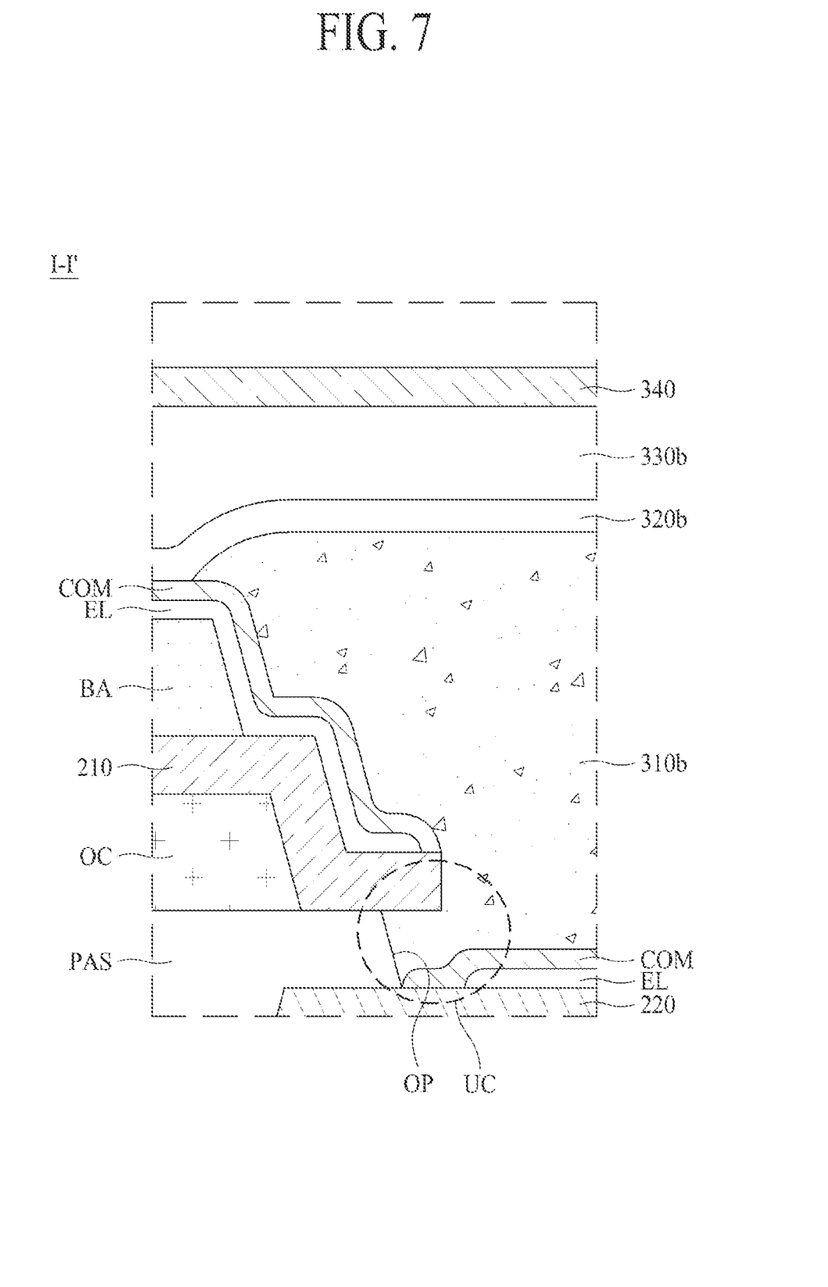
FIG. 7 is a cross-sectional view taken along line I-I' of FIG. 5 according to another embodiment of the present disclosure.

FIG. 5 is a schematic plane view illustrating an example of a display device in a light emitting display device according to the embodiment of the present disclosure. FIG. 6 is a cross-sectional view taken along line I-I' of FIG. 5 according to one embodiment of the present disclosure. FIG. 7 is a cross-sectional view taken along line I-I' of FIG. 5 according to another embodiment of the present disclosure.

Figure 8:
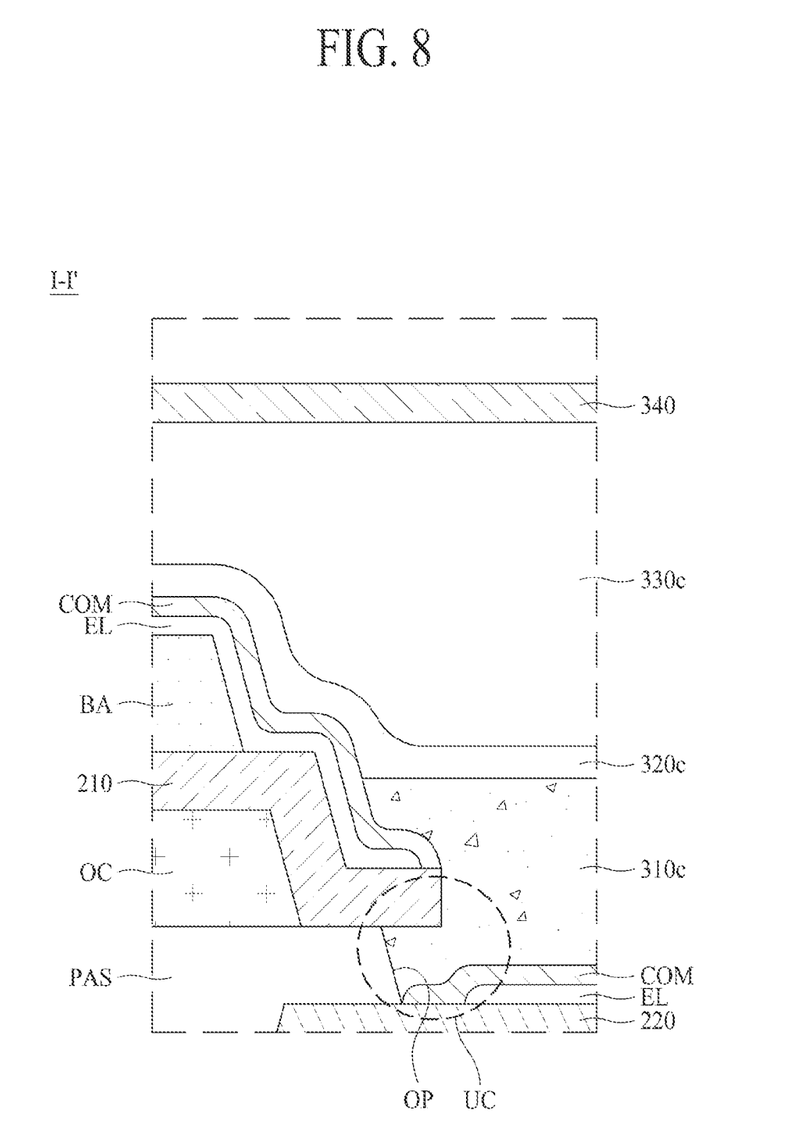
FIG. 8 is a cross-sectional view taken along line I-I' of FIG. 5 according to still another embodiment of the present disclosure.

FIG. 8 is a cross-sectional view taken along line I-I' of FIG. 5 according to other embodiment of the present disclosure. A structure of the auxiliary electrode contact area CA before the filler 310 is disposed is shown in FIG. 5, and a structure in which the filler 310 is disposed in the auxiliary electrode contact area CA in various forms is shown in FIGS. 6 to 8.

Referring to FIG. 5, in the light emitting display device according to one embodiment of the present disclosure, the display panel 110 includes a display area AA and a pad area PA, and a plurality of auxiliary power lines EVSS may be extended from the pad area PA to the display area AA.

The auxiliary power line EVSS may electrically be connected with the common electrode COM through the plurality of auxiliary electrode contact areas CA. The common electrode COM may be formed entirely in the display area AA.

The auxiliary electrode contact area CA (or groove) may include an auxiliary power electrode 220 disposed to overlap the auxiliary power line EVSS, a passivation layer PAS and an overcoat layer OC on the auxiliary power electrode 220, an auxiliary electrode 210 disposed over the passivation layer PAS and the overcoat layer OC, and a bank layer BA defining the auxiliary electrode contact area CA. The passivation layer PAS may include an opening OP that exposes a portion of the auxiliary power electrode 220. The opening OP of the passivation layer PAS may be formed between a portion of the auxiliary power electrode 220 and the auxiliary electrode 210. The opening OP may form an undercut area UC that exposes a portion of the auxiliary power electrode 220 and a portion below one end (or end) of the auxiliary electrode 210. One end (or end) of the auxiliary electrode 210 may serve as an eave. The overcoat layer OC and the passivation layer PAS disposed to correspond to the eave structure of one end (or end) of the auxiliary electrode 210 may be formed to have a step difference structure.

Referring to FIGS. 6 to 8, in the light emitting display device according to one embodiment of the present disclosure, the auxiliary power electrode 220 may be disposed in the auxiliary electrode contact area CA (or groove), and the passivation layer PAS may be disposed on the auxiliary power electrode 220. The overcoat layer OC may be disposed on the passivation layer PAS, and the auxiliary electrode 210 may be disposed over the passivation layer PAS and the overcoat layer OC. Also, the bank layer BA may be disposed on the auxiliary electrode 210. The passivation layer PAS may form an undercut area UC that exposes a portion of the auxiliary power electrode 220 and exposes the portion below one end (or end) of the auxiliary electrode 210.

The light emitting layer EL may be disposed on the auxiliary electrode 210 and the bank layer BA, and the common electrode COM may be disposed on the light emitting layer EL. In addition, the light emitting layer EL may be disposed on the auxiliary power electrode 220 exposed by the undercut area UC, and the common electrode COM may be disposed on the light emitting layer EL.

According to the embodiment of the present disclosure, fillers 310a, 310b and 310c may be disposed in the auxiliary electrode contact area CA (or groove) in various forms. For example, the fillers 310a, 310b and 310c may be formed in an island pattern corresponding to the auxiliary electrode contact area CA.

As shown in FIG. 6, the filler 310a filled in the auxiliary electrode contact area CA (or groove) according to one embodiment of the present disclosure may be filled up to a plane flush with an upper surface of the common electrode COM on the bank layer BA. For example, an upper surface of the filler 310a may be disposed on a plane flush with the upper surface of the common electrode COM on the bank layer BA. For example, the filler 310a filled in the auxiliary electrode contact area CA may be disposed to reach the plane flush with the upper surface of the common electrode COM on the bank layer BA by using a spin coating method.

The first inorganic film 320a, the organic film 330a and the second inorganic film 340, which constitute the encapsulation layer, may sequentially be deposited on the filler 310a filled in the common electrode COM and the auxiliary electrode contact area CA. Since the first inorganic film 320a and the organic film 330a may be flat without a step difference because the common electrode COM and the filter 310a are flush with each other. Therefore, a seam may be prevented from occurring in the first inorganic film 320a disposed on the common electrode COM and the filler 310a.

As shown in FIG. 7, the filler 310b filled in the auxiliary electrode contact area CA (or groove) according to another embodiment of the present disclosure may be filled to cover a portion of the upper surface of the common electrode COM on the bank layer BA. The filler 310b may be disposed to overlap a portion of the upper surface of the bank layer BA. For example, the upper surface of the filler 310b may cover a portion of the upper surface of the common electrode COM on the bank layer BA. Further, the filler 310b may cover a partial upper surface of the bank layer BA as well as a side of the bank layer BA. The filler 310b may be filled to cover a portion of a peripheral area of the auxiliary electrode contact area CA. The filler 310b may be disposed to cover a portion of the common electrode COM positioned on the upper surface of the bank layer BA by using a slot die coating method or an ink-jet coating method.

The first inorganic film 320b, the organic film 330b and the second inorganic film 340, which constitute the encapsulation layer, may sequentially be deposited on the filler 310b filled in the common electrode COM and the auxiliary electrode contact area CA, covering a portion of the common electrode COM. The filler 310b may remove the step difference caused by the auxiliary electrode contact area CA by filling the auxiliary electrode contact area CA. Therefore, a seam may be prevented from occurring in the first inorganic film 320b disposed on the common electrode COM and the filler 310b.

As shown in FIG. 8, the filler 310c filled in the auxiliary electrode contact area CA (or groove) according to other embodiment of the present disclosure may be disposed between the upper surface of the common electrode COM on the bank layer BA and the upper surface of the passivation layer PAS. The filler 310c may be disposed to overlap one end (or end) of the auxiliary electrode 210. For example, an upper surface of the filler 310c may cover a portion of an upper surface of the auxiliary electrode 210. Alternatively, the upper surface of the filler 310c may cover an upper surface of the auxiliary electrode 210. For example, the filler 310c may fill the undercut area UC of the passivation layer PAS. The upper surface of the filler 310c may be disposed between the upper surface of the common electrode COM on the bank layer BA and the upper surface of the passivation layer PAS. The filler 310c may be filled in a portion of the step difference (or space) caused by the auxiliary electrode contact area CA (or groove) and disposed to cover a high step difference area of the auxiliary electrode contact area CA.

In addition, although it is not shown in the drawings, according to another embodiment of the present disclosure, the filler 310c filled in the auxiliary electrode contact area CA (or groove) may not be particularly limited as long as the undercut area UC is filled with the filler 310*c*. For example, the filler 310*c* may be filled in the auxiliary electrode contact area CA (or groove) so that an upper surface of the filler 310*c* is equal to or higher than an upper surface of the passivation layer PAS (i.e., an upper surface of the auxiliary electrode contact area CA groove).

The first inorganic film 320*c*, the organic film 330*c* and the second inorganic film 340, which constitute the encapsulation layer, may sequentially be deposited on the filler 310*c* that is at least partially filled in the common electrode COM and the auxiliary electrode contact area CA. The filler 310*c* may mitigate the step difference caused by the auxiliary electrode contact area CA by filling the auxiliary electrode contact area CA. Therefore, a seam may be prevented from occurring in the first inorganic film 320*c* disposed on the common electrode COM and the filler 310*c*.

Figure 9:
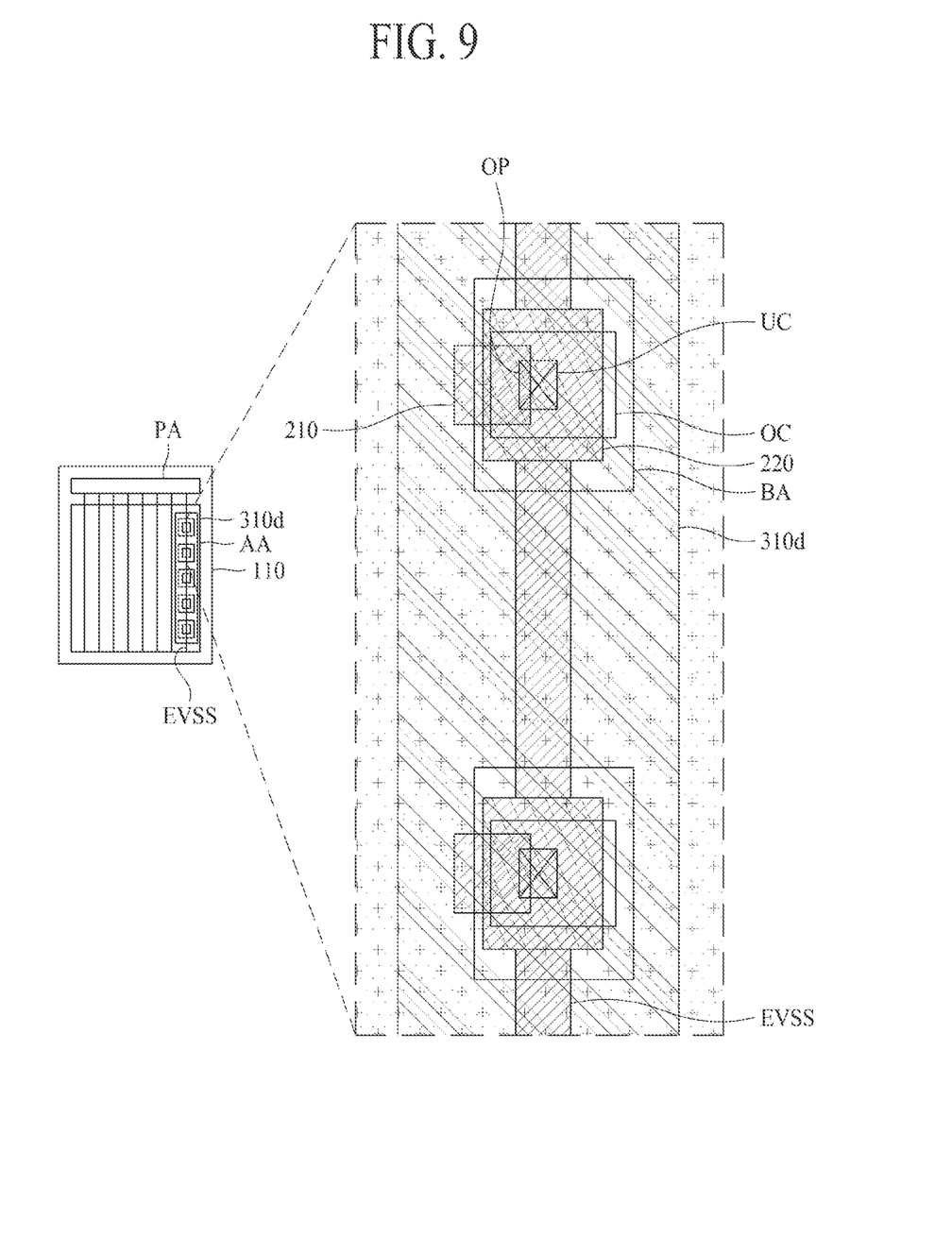
FIG. 9 is a schematic plane view illustrating another example of a display device in a light emitting display device according to the embodiment of the present disclosure.

FIG. 9 is a schematic plane view illustrating another example of a display device in a light emitting display device according to the embodiment of the present disclosure.

Referring to FIG. 9, in the light emitting display device according to another embodiment of the present disclosure, the display panel 110 includes a display area AA and a pad area PA, and a plurality of auxiliary power lines EVSS may be extended from the pad area PA to the display area AA.

The auxiliary power line EVSS may electrically be connected with the common electrode COM through a plurality of auxiliary electrode contact areas CA. The common electrode COM may be formed entirely on the display area AA.

The auxiliary electrode contact area CA (or groove) may include an auxiliary power electrode 220 disposed to overlap the auxiliary power line EVSS, a passivation layer PAS on the auxiliary power electrode 220, an auxiliary electrode 210 disposed over the passivation layer PAS and the overcoat layer OC, and a bank layer BA defining the auxiliary electrode contact area CA. The passivation layer PAS may include an opening OP that exposes a portion of the auxiliary power electrode 220. The opening OP of the passivation layer PAS may be formed between a portion of the auxiliary power electrode 220 and the auxiliary electrode 210. The opening OP may form an undercut area UC that exposes a portion of the auxiliary power electrode 220 and a portion below one end (or end) of the auxiliary electrode 210. One end (or end) of the auxiliary electrode 210 may serve as an eave. The overcoat layer OC and the passivation layer PAS, which are disposed to correspond to the eave structure of one end (or end) of the auxiliary electrode 210, may be formed to have a step difference structure.

As shown in FIG. 9, in the light emitting display device according to another embodiment of the present disclosure, a filler 310*d* may be formed in a line pattern that is overlapped with the auxiliary power line EVSS. For example, the filler 310*d* may be formed in a line pattern, which is overlapped with the auxiliary power line EVSS, by using a slot die coating method or an ink-jet coating method, and may be disposed to be filled in the groove by the auxiliary electrode contact area CA.

The light emitting display according to one embodiment of the present disclosure may be described as follows.

A light emitting display device according to the embodiment of the present disclosure may comprise a substrate, a circuit layer having a thin film transistor and an auxiliary power electrode disposed on the substrate, an insulating layer disposed on the circuit layer and including a first opening which exposes a portion of the auxiliary power electrode, a pixel electrode disposed on the insulating layer and connected to the thin film transistor, an auxiliary electrode contact area formed in the insulating layer, an auxiliary electrode formed on the insulating layer, a light emitting layer disposed on the pixel electrode and the auxiliary electrode, a common electrode disposed on the light emitting layer and electrically connected with the auxiliary power electrode through the auxiliary electrode contact area, a filler disposed in the auxiliary electrode contact area, and an encapsulation layer disposed on the common electrode and the filler, wherein the first opening of the insulating layer includes an undercut area between the auxiliary power electrode and the auxiliary electrode, and wherein the undercut area is filled with the filler.

In the light emitting display device according to the embodiment of the present disclosure, the filler may include an organic material.

In the light emitting display device according to the embodiment of the present disclosure, the encapsulation layer may include a first inorganic film disposed on the common electrode and the filler, an organic film disposed on the first inorganic film, and a second inorganic film disposed on the organic film.

The light emitting display device according to the embodiment of the present disclosure may further comprise a color filter disposed on the encapsulation layer and overlapped with the pixel electrode.

The light emitting display device according to the embodiment of the present disclosure may further comprise a bank layer disposed on the insulating layer, defining a second opening on the pixel electrode, wherein the light emitting layer may be disposed on the pixel electrode and the bank layer.

In the light emitting display device according to the embodiment of the present disclosure, an upper surface of the filler may be disposed between an upper surface of the common electrode on the bank layer and an upper surface of the insulating layer.

In the light emitting display device according to the embodiment of the present disclosure, the upper surface of the filler may be overlapped with a portion of the bank layer.

In the light emitting display device according to the embodiment of the present disclosure, the upper surface of the filler may cover a portion of the common electrode on the bank layer.

In the light emitting display device according to the embodiment of the present disclosure, the upper surface of the filler may be disposed to be flush with the upper surface of the common electrode on the bank layer.

In the light emitting display device according to the embodiment of the present disclosure, the filler may be formed in an island pattern corresponding to the auxiliary electrode contact area.

The light emitting display device according to the embodiment of the present disclosure may further comprise an auxiliary power line electrically connected to the auxiliary power electrode, wherein the filler may be formed in a line pattern overlapped with the auxiliary power line.

A light emitting display device according to the embodiment of the present disclosure may comprise a substrate, a circuit layer having a thin film transistor and an auxiliary power electrode disposed on the substrate, an insulating layer disposed on the circuit layer, a pixel electrode disposed on the insulating layer and connected to the thin film transistor, an auxiliary electrode formed on the insulating layer, a groove formed in an insulating layer to expose a portion of the auxiliary power electrode, a light emitting layer disposed on the pixel electrode and the auxiliary electrode, a common electrode disposed on the light emitting layer and the auxiliary electrode and electrically connected with the auxiliary power electrode through the groove, a filler disposed in the groove so that an upper surface of filler is equal to or higher than an upper surface of the groove, and an encapsulation layer disposed on the common electrode and the filler.

In the light emitting display device according to the embodiment of the present disclosure, the pixel electrode and the auxiliary electrode may be made of the same material.

In the light emitting display device according to the embodiment of the present disclosure, the undercut area may be disposed below an eave structure by an end of the auxiliary electrode.

The light emitting display device according to the embodiment of the present disclosure may further comprise a bank layer disposed on the insulating layer, defining a second opening on the pixel electrode, wherein the light emitting layer may be disposed on the pixel electrode and the bank layer.

In the light emitting display device according to the embodiment of the present disclosure, the filler may be filled in the groove between the upper surface of the common electrode on the bank layer and an upper surface of the insulating layer.

In the light emitting display device according to the embodiment of the present disclosure, the filler may be filled in the groove overlapped with a portion of the bank layer.

In the light emitting display device according to the embodiment of the present disclosure, the filler may cover a portion of the common electrode on the bank layer.

In the light emitting display device according to the embodiment of the present disclosure, the filler may be filled in the groove flush with the upper surface of the common electrode on the bank layer.

In the light emitting display device according to the embodiment of the present disclosure, the filler may be formed in an island pattern that is filled to correspond to the groove.

The light emitting display device according to the embodiment of the present disclosure may further comprise an auxiliary power line electrically connected with the auxiliary power electrode, wherein the filler may be formed in a line pattern overlapped with the auxiliary power line and filled in the groove.

According to the present disclosure, the following advantageous effects may be obtained.

The light emitting display device according to the present disclosure may fill an organic film in an undercut area in which a cathode electrode and a low potential power line are in contact with each other, to minimize a step difference with a peripheral area, thereby preventing a seam from occurring in an inorganic film to be deposited and blocking a moisture permeation path on the inorganic film through the organic film. As a result, reliability of the light emitting display device is improved.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting display device comprising:
a substrate;
a circuit layer having a thin film transistor and an auxiliary power electrode disposed on the substrate;
an insulating layer disposed on the circuit layer and including a first opening which exposes a portion of the auxiliary power electrode;
a pixel electrode disposed on the insulating layer and connected to the thin film transistor;
an auxiliary electrode contact area formed in the insulating layer;
an auxiliary electrode formed on the insulating layer;
a light emitting layer disposed on the pixel electrode and the auxiliary electrode;
a common electrode disposed on the light emitting layer and electrically connected with the auxiliary power electrode through the auxiliary electrode contact area;
a filler disposed in the auxiliary electrode contact area; and
an encapsulation layer disposed on the common electrode and the filler,
wherein the first opening of the insulating layer includes an undercut area between the auxiliary power electrode and the auxiliary electrode, and
wherein the undercut area is filled with the filler.

2. The light emitting display device of claim 1, wherein the filler includes an organic material.

3. The light emitting display device of claim 1, wherein the encapsulation layer includes:
a first inorganic film disposed on the common electrode and the filler;
an organic film disposed on the first inorganic film; and
a second inorganic film disposed on the organic film.

4. The light emitting display device of claim 3, further comprising a color filter disposed on the encapsulation layer and overlapped with the pixel electrode.

5. The light emitting display device of claim 4, further comprising a bank layer disposed on the insulating layer, defining a second opening on the pixel electrode,
wherein the light emitting layer is disposed on the pixel electrode and the bank layer.

6. The light emitting display device of claim 5, wherein an upper surface of the filler is disposed between an upper surface of the common electrode on the bank layer and an upper surface of the insulating layer.

7. The light emitting display device of claim 6, wherein the upper surface of the filler is overlapped with a portion of the bank layer.

8. The light emitting display device of claim 7, wherein the upper surface of the filler covers a portion of the common electrode on the bank layer.

9. The light emitting display device of claim 7, wherein the upper surface of the filler is flush with the upper surface of the common electrode on the bank layer.

10. The light emitting display device of claim 1, wherein the filler is formed in an island pattern corresponding to the auxiliary electrode contact area.

11. The light emitting display device of claim 1, further comprising an auxiliary power line electrically connected to the auxiliary power electrode,
wherein the filler is formed in a line pattern overlapped with the auxiliary power line.

12. A light emitting display device comprising:
a substrate;
a circuit layer having a thin film transistor and an auxiliary power electrode disposed on the substrate;

an insulating layer disposed on the circuit layer;
a pixel electrode disposed on the insulating layer and connected to the thin film transistor;
an auxiliary electrode formed on the insulating layer;
a groove formed in the insulating layer to expose a portion of the auxiliary power electrode;
a light emitting layer disposed on the pixel electrode and the auxiliary electrode;
a common electrode disposed on the light emitting layer and the auxiliary electrode and electrically connected with the auxiliary power electrode through the groove;
a filler disposed in the groove so that an upper surface of the filler is equal to or higher than an upper surface of the groove; and
an encapsulation layer disposed on the common electrode and the filler,
wherein an undercut area is disposed below an eave structure by an end of the auxiliary electrode.

13. The light emitting display device of claim 12, wherein the pixel electrode and the auxiliary electrode are made of the same material.

14. The light emitting display device of claim 12, further comprising a bank layer disposed on the insulating layer, defining a second opening on the pixel electrode,
wherein the light emitting layer is disposed on the pixel electrode and the bank layer.

15. The light emitting display device of claim 14, wherein the filler is filled in the groove between the upper surface of the common electrode on the bank layer and an upper surface of the insulating layer.

16. The light emitting display device of claim 15, wherein the filler is filled in the groove overlapped with a portion of the bank layer.

17. The light emitting display device of claim 16, wherein the filler covers a portion of the common electrode on the bank layer.

18. The light emitting display device of claim 16, wherein the filler is filled in the groove flush with the upper surface of the common electrode on the bank layer.

19. The light emitting display device of claim 12, wherein the filler is formed in an island pattern that is filled to correspond to the groove.

20. The light emitting display device of claim 12, further comprising an auxiliary power line electrically connected with the auxiliary power electrode,
wherein the filler is formed in a line pattern overlapped with the auxiliary power line and filled in the groove.

* * * * *